United States Patent
Yen et al.

(10) Patent No.: US 10,629,756 B2
(45) Date of Patent: Apr. 21, 2020

(54) SEMICONDUCTOR STRUCTURE

(71) Applicant: Taiwan Semiconductor Manufacturing Co., Ltd., Hsin-Chu (TW)

(72) Inventors: Hsiao-Tsung Yen, Tainan (TW); Yu-Ling Lin, Taipei (CA); Chin-Wei Kuo, Zhubei (TW); Ho-Hsiang Chen, Hsinchu (TW); Chewn-Pu Jou, Hsinchu (TW); Min-Chie Jeng, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 28 days.

(21) Appl. No.: 15/922,780

(22) Filed: Mar. 15, 2018

(65) Prior Publication Data

US 2018/0204958 A1 Jul. 19, 2018

Related U.S. Application Data

(62) Division of application No. 13/615,503, filed on Sep. 13, 2012, now Pat. No. 9,923,101.

(51) Int. Cl.
| | |
|---|---|
| *H01L 29/94* | (2006.01) |
| *H01L 29/66* | (2006.01) |
| *H01L 21/66* | (2006.01) |
| *H01L 27/06* | (2006.01) |
| *H01L 49/02* | (2006.01) |
| *H01L 23/48* | (2006.01) |
| *H01L 23/58* | (2006.01) |

(52) U.S. Cl.
CPC ........ *H01L 29/94* (2013.01); *H01L 29/66181* (2013.01); *H01L 22/34* (2013.01); *H01L 23/481* (2013.01); *H01L 23/585* (2013.01); *H01L 27/0629* (2013.01); *H01L 28/60* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 4,442,529 A | | 4/1984 | Ahuja et al. |
| 5,173,835 A | * | 12/1992 | Cornett ............. H01L 29/66181 257/310 |
| 5,512,710 A | * | 4/1996 | Schroeder .......... G01R 31/2818 174/262 |
| 5,786,630 A | | 7/1998 | Bhansali |
| 6,329,715 B1 | | 12/2001 | Hayashi |
| 2001/0022365 A1 | * | 9/2001 | Murade ............. H01L 29/78609 257/59 |
| 2001/0038115 A1 | | 11/2001 | Amanuma |
| 2003/0200654 A1 | | 10/2003 | Omote |
| 2005/0013088 A1 | | 1/2005 | Horikawa |
| 2005/0186934 A1 | | 8/2005 | Yajima et al. |
| 2005/0275004 A1 | | 12/2005 | Watanabe |
| 2006/0001124 A1 | | 1/2006 | Ayazi |

(Continued)

*Primary Examiner* — Davienne N Monbleau
*Assistant Examiner* — Scott R Wilson
(74) *Attorney, Agent, or Firm* — Duane Morris LLP

(57) ABSTRACT

A semiconductor structure is provided. The semiconductor structure includes a floating substrate; and a capacitor grounded and connected to the floating substrate. A method of manufacturing a semiconductor structure is also provided.

20 Claims, 4 Drawing Sheets

(56) References Cited

U.S. PATENT DOCUMENTS

| | | |
|---|---|---|
| 2006/0022678 A1* | 2/2006 | Hegazy .............. G01R 31/2853 |
| | | 324/525 |
| 2007/0158818 A1 | 7/2007 | Tang |
| 2009/0134500 A1 | 5/2009 | Kuo |
| 2009/0146760 A1 | 6/2009 | Reefman et al. |
| 2011/0168782 A1 | 7/2011 | Bergler |
| 2012/0061795 A1 | 3/2012 | Yen et al. |
| 2013/0069440 A1 | 3/2013 | Marukame et al. |
| 2013/0258627 A1* | 10/2013 | Guo ..................... H01L 23/147 |
| | | 361/782 |
| 2013/0264676 A1 | 10/2013 | Yang et al. |

* cited by examiner

SEMICONDUCTOR STRUCTURE

RELATED APPLICATION

This application is a divisional application of U.S. patent application Ser. No. 13/615,503, filed on Sep. 13, 2012, which is incorporated by reference herein in its entirety.

TECHNICAL FIELD

The present disclosure relates to a semiconductor structure, and more particularly to a semiconductor structure having a floating substrate.

BACKGROUND

The 3D IC technology has been widely used instead of the 2D IC technology due to its shorter total wirelength than that of the 2D IC technology. In the structure of the 3D IC, the floating substrate is a typical component where there are interconnections for conducting electrical signals. However, the coupling capacitance existing in the mentioned interconnections will result in a noticeable cross-talk effect. Therefore, there is a need to solve the above problem.

SUMMARY

In accordance with one aspect of the present disclosure, a semiconductor structure is provided. The semiconductor structure includes a floating substrate; and a capacitor grounded and connected to the floating substrate.

In accordance with another aspect of the present disclosure, a semiconductor structure is provided. The semiconductor structure includes a floating substrate; and a conductive piece spaced from the floating substrate to form a capacitor, wherein the conductive piece is grounded.

In accordance with one more aspect of the present disclosure, a method of manufacturing a semiconductor structure is provided. The method includes locating a coupled capacitor generating a noise signal; and grounding a formed capacitor to discharge therethrough the noise signal.

The above objects and advantages of the present disclosure will become more readily apparent to those ordinarily skilled in the art after reviewing the following detailed descriptions and accompanying drawings, in which:

DETAILED DESCRIPTION

Figure 1A:
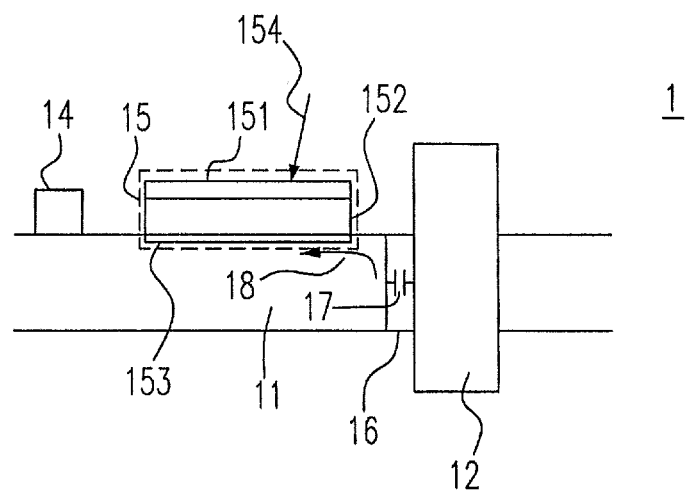
FIG. 1(a) is a diagram showing a semiconductor structure according to one embodiment of the present disclosure.

The present disclosure will be described with respect to particular embodiments and with reference to certain drawings, but the disclosure is not limited thereto but is only limited by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to a device consisting only of components A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or methods may be combined in any suitable manner, as would be apparent to one of ordinary skill in the art from this disclosure, in one or more embodiments.

Similarly it should be appreciated that in the description of exemplary embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments may be practiced without these specific details. In other instances, well-known methods, structures and techniques have not been shown in detail in order not to obscure an understanding of this description.

The invention will now be described by a detailed description of several embodiments. It is clear that other embodiments can be configured according to the knowledge of persons skilled in the art without departing from the true technical teaching of the present disclosure, the claimed invention being limited only by the terms of the appended claims.

Figure 1B:
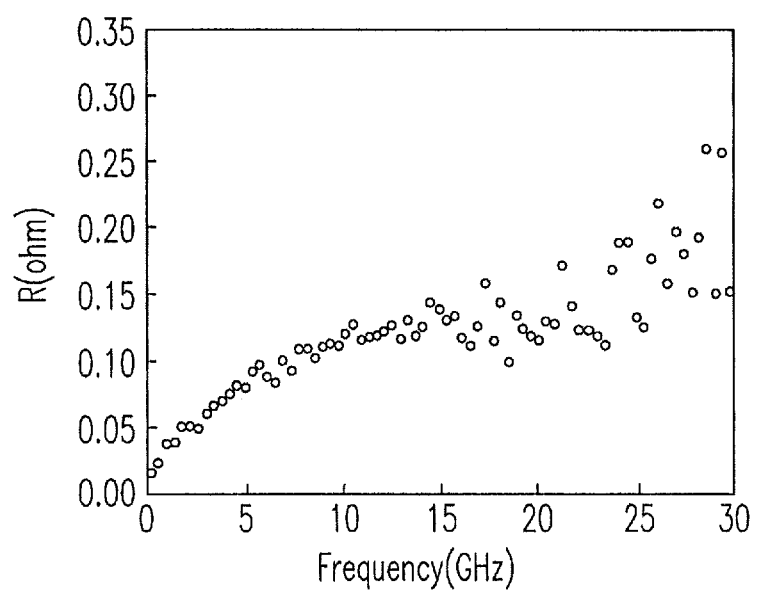
FIG. 1(b) is a diagram showing the measured resistance value versus the signal frequency.
Figure 1C:
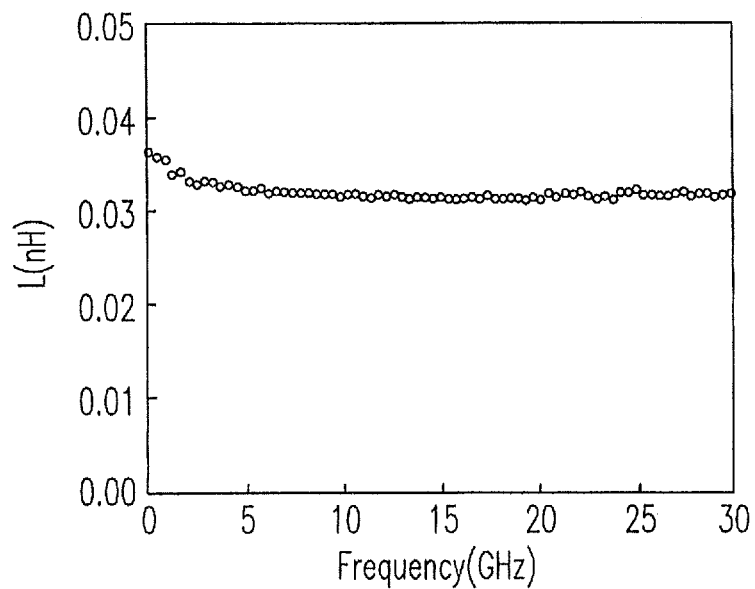
FIG. 1(c) is a diagram showing the measured inductance value versus the signal frequency.
Figure 1D:
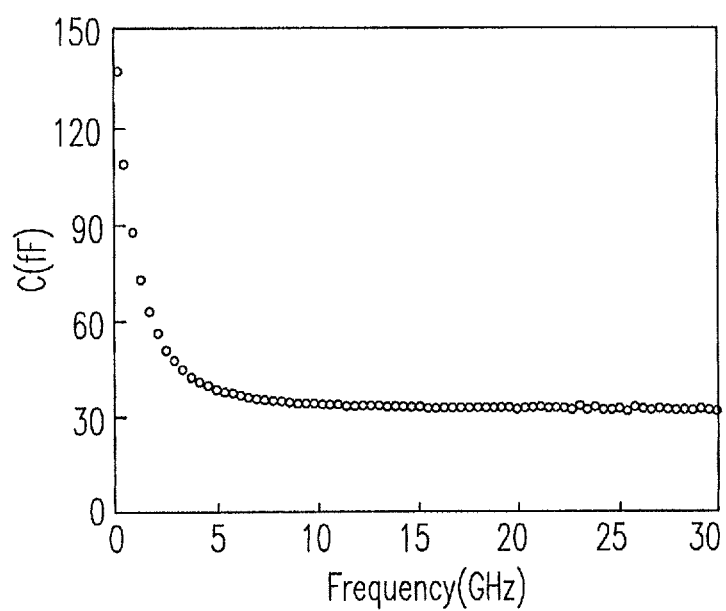
FIG. 1(d) is a diagram showing the measured capacitance value versus the signal frequency.

Please refer to FIG. 1(a), which is a diagram showing a semiconductor structure according to one embodiment of the present disclosure. As shown in FIG. 1(a), the semiconductor structure 1 includes a floating substrate 11, a through-silicon via (TSV) 12, a liner 16 connected to the through-silicon via 12, an electrical device 14 and a grounded capacitor 15. The grounded capacitor 15 includes a metal layer 151, a semiconductor layer 153 which is connected to the floating substrate 11, and a dielectric layer 152 disposed between the metal layer 151 and the semiconductor layer 153, wherein the semiconductor layer 153 is induced by applying an AC/DC signal 154 to the metal layer 151. Typically, a coupled capacitor 17, for example, would be formed between the TSV 12 and the floating substrate 11 both having conductive characteristics, since the liner 16 disposed between the TSV 12 and the floating substrate 11 has a non-conductive characteristic. Further, if a ground is provided in the semiconductor structure 1 which serves as a testkey to operate in a radio frequency, then the S-parameters of the components of the semiconductor structure 1 can be obtained, so that the RLC (Resistance-Inductance-Capacitance) characteristics of the components of the semiconductor structure 1 can be evaluated after implementing the well-known S-parameter transformation method where an admittance matrix describing the behavior of a corresponding circuit network simulating the components of the semiconductor structure 1 would be utilized. Therefore, since the grounded capacitor 15 is grounded, a necessary ground definition for the floating substrate 11 can be provided when the semiconductor structure 1 serving as a testkey operates at a radio frequency, so as to measure the respective S-parameters of the floating substrate 11, the TSV 12 and the coupled capacitor 17. Since the S-parameters can be obtained, the respective RLC characteristics of the floating substrate 11, the TSV 12 and the coupled capacitor 17 can therefore be obtained by implementing the S-parameter transformation method. In FIG. 1(b), there can be seen the measured resistance value of TSV 12 versus the signal frequency having a range from 0 to 30 GHz. In FIG. 1(c), there can be seen the measured inductance value of TSV 12 versus the signal frequency having a range from 0 to 30 GHz. In FIG. 1(d), there can be seen the measured capacitance value of TSV 12 versus the signal frequency having a range from 0 to 30 GHz. The measured resistance, inductance and capacitance values for TSV 12 as a DUT (Device Under Test) can be provided as the reference data for a process designer to realize what improvements have been achieved to manufacture the semiconductor structure 1. The plots of the above RLC characteristics are derived from the exemplary condition that the grounded capacitor 15 and the coupled capacitor 17 are connected in series and that in the implementation of the well-known L-2L de-embedding methodology for de-embedding the TSV 12, a capacitance of 4 pF is included between the metal layer 151 and the semiconductor layer 153 which has a material property different from or identical to that of the floating substrate 11.

Further, as shown in Table 1, in the condition that the coupled capacitor 17 has a predetermined capacitance (C17) of 100 fF, when the capacitance (C15) of the grounded capacitor 15 increases, the error rate of the measured capacitance (meas_C17) of the coupled capacitor 17 decreases. In other words, it could be seen the larger capacitance the grounded capacitor 15 has, the smaller the error rate is. Accordingly, depending on the tolerable error rate for the process designer to implement the semiconductor structure 1, a corresponding capacitance could be decided to be stored between the metal layer 151 and the semiconductor layer 153. According to Table 1, if the tolerable error rate for the process designer is set to be less than 3% (e.g. 2.44%), a corresponding capacitance equal to or higher than 4000 fF could be decided to be stored between the metal layer 151 and the semiconductor layer 153 of the grounded capacitor 15 which is connected to the coupled capacitor 17 in series. Therefore, based on the relevant circuit principal that a capacitor having a larger capacitance under a given operating frequency would provide a less impedance, when the semiconductor structure 1 is operated at a radio frequency, the degree at which the noise signal 18 from the coupled capacitor 17 affects the electrical device 14 could be decreased to a degree at least within the set tolerable error rate, and there could be a reduced impact on the above plotted RLC characteristics of TSV 12 as a DUT. For storing a predetermined capacitance between the metal layer 151 and the semiconductor layer 153, the dielectric layer 152 could be formed by the low-k material such as a fluorosilicate glass (FSG), an un-doped silicate glass (USG), a silicon nitride or an inter layer dielectric (ILD), and the semiconductor layer 153 could be lightly doped and have a resistance in the range of 1~1.7 ohm, 10~30 ohm, or 5~100 ohm. Further, depending on the applications of the semiconductor structure 1, the radio frequency at which the semiconductor structure 1 is operated can be in the range of such as 0.1~100 GHz, the electrical device 14 can be a metal insulator metal (MIM) capacitor, a metal oxide metal (MOM) capacitor, an inductor, a MOSFET, or a MOS capacitor, and the floating substrate 11 can be a lightly doped n-type or p-type substrate.

TABLE 1

| C15 (fF) | C17 (fF) | Meas_C17 (fF) | Error rate (%) |
| --- | --- | --- | --- |
| 200 | 100 | 66.67 | 33.33 |
| 1000 | 100 | 90.91 | 9.09 |
| 2000 | 100 | 95.24 | 4.76 |
| 4000 | 100 | 97.56 | 2.44 |
| 12000 | 100 | 99.17 | 0.83 |

Figure 2:
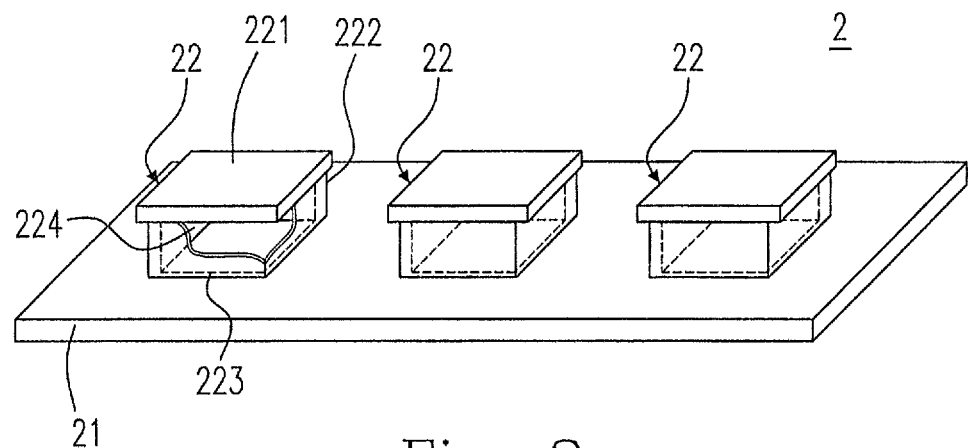
FIG. 2 is a diagram showing a metal structure alternative to the metal layer of the semiconductor structure of FIG. 1(a)

Please refer to FIG. 2, which is a diagram showing a metal structure 2 as an alternative to the metal layer 151 of the semiconductor structure 1 of FIG. 1(a). As shown in FIG. 2, the metal structure 2 includes at least a structure unit 22 and a first metal layer 21. According to the required design rules for manufacturing the semiconductor structure 1, the semiconductor structure 1 can be implemented in such a way that the structure unit 22 includes a second metal layer 221, a hole 223 formed in the first metal layer 21, and a via structure 222 including an empty space 224 and disposed between the hole 223 and the second metal layer 221, and that each of the first metal layer 21 and the second metal layer 221 parallel thereto includes the material of Cu, Al, AlCu or poly-Si.

Figure 3:
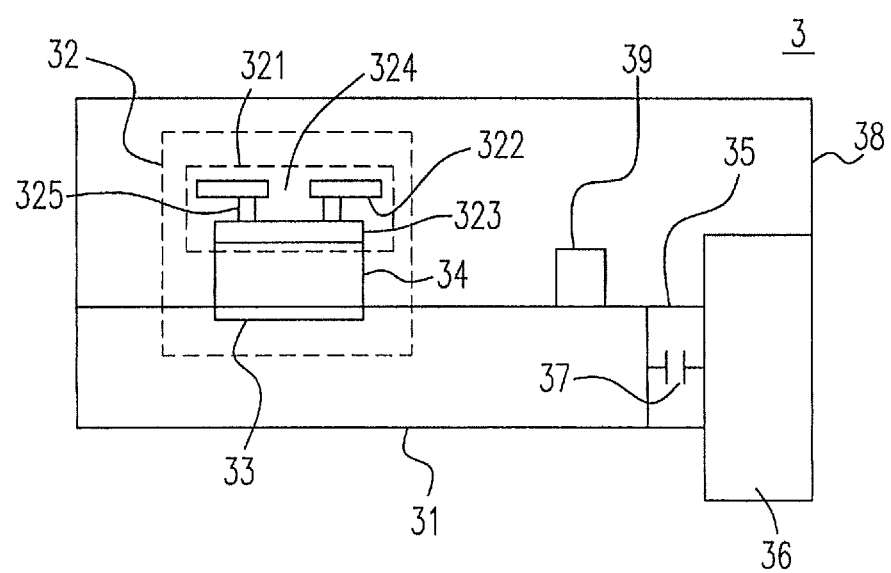
FIG. 3 is a diagram showing a semiconductor structure according to another embodiment of the present disclosure.

Please refer to FIG. 3, which is a diagram showing a semiconductor structure according to another embodiment of the present disclosure. In this embodiment, the semiconductor structure is an RF IC 3. The RF IC 3 includes an electrical device 39, a floating substrate 31, a TSV 36, a liner 35 which is disposed between the TSV 36 and the floating substrate 31 and can be an oxide layer, a dielectric structure 38 including a dielectric part 34 and connected to the floating substrate 31, and a capacitor 32 including a semiconductor layer 33, and a grounded conductive piece 321, wherein the electrical device 39 and the grounded conductive piece are incorporated into the dielectric structure 38. Further, it can be seen that the grounded conductive piece 321 is spaced from the floating substrate 31, so that the dielectric part 34 can be disposed therebetween. The grounded conductive piece 321 includes a first metal layer 323, a second metal layer 322 parallel to the first metal layer 323, and at least a via structure 325 disposed between the first metal layer 323 and the second metal layer 322. The first metal layer 323 can be a gate metal layer, and is closer to the floating substrate 31 than the second metal layer 322 which could comprise the material of Cu, Al, AlCu, or poly-Si. The second metal layer 322 includes a hole 324. Typically, a coupled capacitor 37 would be formed between the TSV 36 and the floating substrate 31 both having conductive characteristics, since the liner 35 disposed between the TSV 36 and the floating substrate 31 has a non-conductive characteristic. Since the conductive piece 321 is grounded, when the RF IC 3 is operated at a radio frequency, a noise signal (not shown) from the coupled capacitor 37 can be picked up by the capacitor 32 so that the electrical device 39 is not affected by the noise signal. For picking up the noise signal, the capacitance equal to or higher than 4 pF or in the range of 1 pF 10 pF is stored between the conductive piece 321 and the semiconductor layer 33. For having the capacitance equal to or higher than 4 pF or in the range of 1 pF~10 pF, the dielectric part 34 could be formed by the low-k material such as a fluorosilicate glass (FSG), an un-doped silicate glass (USG) or a silicon nitride, and the semiconductor layer 33 could be lightly doped and have a resistance in the range of 1~1.7 ohm, 10~30 ohm, or 5~100 ohm.

Figure 4:
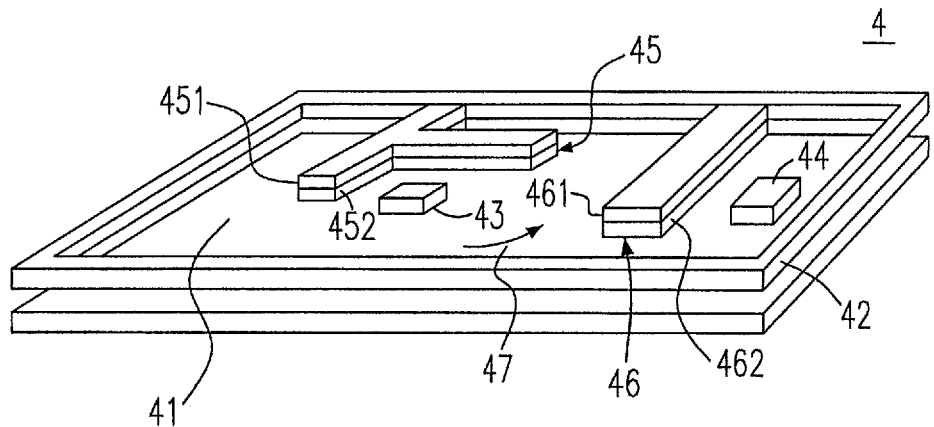
FIG. 4 is a diagram showing a semiconductor structure according to a further embodiment of the present disclosure.

Please refer to FIG. 4, which is a diagram showing a semiconductor structure 4 according to a further embodiment of the present disclosure. In the semiconductor structure 4 having a seal ring 42 which can prevent an IC package (not shown) from cracking when the semiconductor structure 4 is incorporated into the IC package, a floating substrate 41, a first electrical device 43, a second electrical device 44, at least a first capacitor 45 and at least a second capacitor 46 are included. The first capacitor 45 includes a first metal structure 451, a first semiconductor layer (not shown) connected to the floating substrate 41, and a first dielectric layer 452 disposed between the first semiconductor layer and the first metal structure 451, wherein the first metal structure 451 is a depletion region on the floating substrate 41. The second capacitor 46 includes a second metal structure 461, a second semiconductor layer (not shown) connected to the floating substrate 41, and a second dielectric layer 462 disposed between the second semiconductor layer and the second metal structure 461. For meeting the configuration requirements of the semiconductor structure 4, the implementation could be made in such a way that the first semiconductor structure 451 has a T shape and the second semiconductor structure 461 has a rectangular shape.

The first metal structure 451 and the second metal structure 461 are both connected to the seal ring 42 for being grounded, so as to prevent a noise signal 47 from affecting the first electrical device 43 and the second electrical device 44. On the other hand, depending on the applications of the semiconductor structure 4, the radio frequency at which the semiconductor structure 4 is operated can be in the range of such as 0.1 GHz 100 GHz, each of the first and second electrical devices 44-45 can be implemented as a metal insulator metal (MIM) capacitor, a metal oxide metal (MOM) capacitor, an inductor, a MOSFET, or a MOS capacitor, each of the first and second semiconductor layer could be formed by a p-well/n-well layer or a p/n doped layer, and the floating substrate can be a lightly doped n-type or p-type substrate 41.

Figure 5:
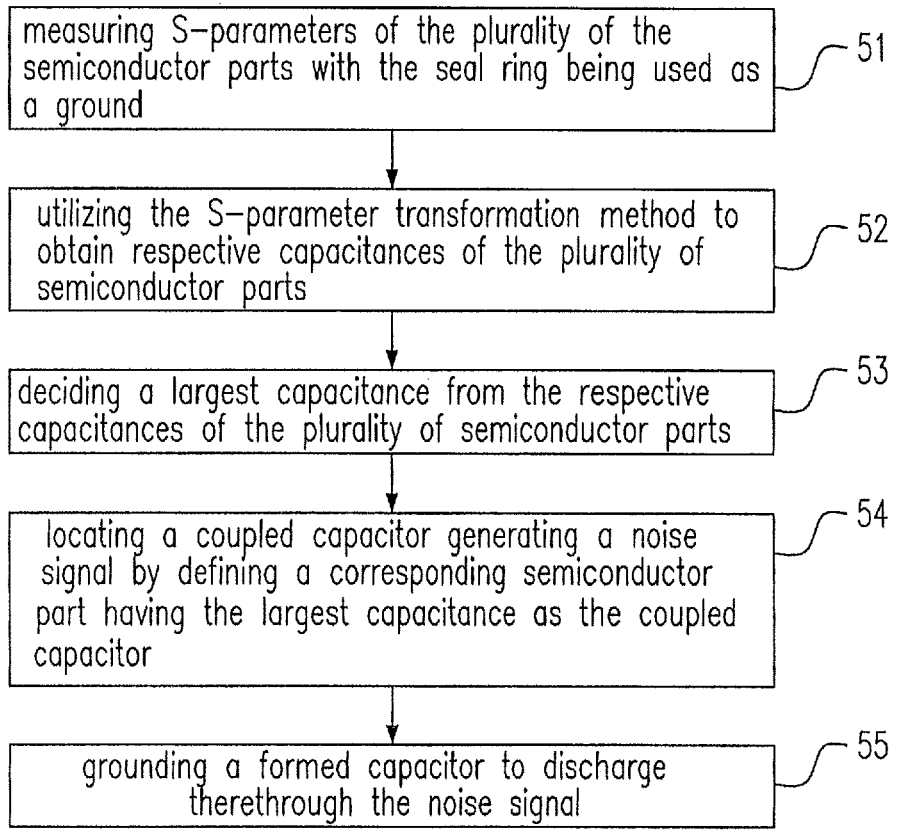
FIG. 5 is a flow chart of a method of manufacturing a semiconductor structure according to one embodiment of the present disclosure.

Please refer to FIG. 5, which is a flow chart of a method of manufacturing a semiconductor structure including a plurality of semiconductor parts and a seal ring according to one embodiment of the present disclosure. The method includes the steps of measuring S-parameters of the plurality of the semiconductor parts with the seal ring being used as a ground (step 51), utilizing the S-parameter transformation method to obtain respective capacitances of the plurality of semiconductor parts (step 52), deciding a largest capacitance from the respective capacitances of the plurality of semiconductor parts (step 53), locating a coupled capacitor generating a noise signal by defining a corresponding semiconductor part having the largest capacitance as the coupled capacitor (step 54), and grounding a formed capacitor to discharge therethrough the noise signal (step 55). In the step 51, a commercial available network analyzer such as a power network analyzer (PNA) or a vector network analyzer (VNA) could be utilized for measuring the S-parameters. In the S-parameter transformation method of the step 52, as an example, an admittance matrix would be established for describing the behavior of a circuit network simulating the semiconductor structure, and the respective capacitances could be derived by dividing the imaginary part of a corresponding element of the admittance matrix by $2\pi f$, wherein f is an operating frequency at which the semiconductor structure operates. The formed capacitor has but is not limited to the structure of the grounded capacitor 15 shown in FIG. 1(a).

In accordance with one embodiment of the present disclosure, a semiconductor structure is provided. The semiconductor structure comprises a floating substrate and a capacitor grounded and connected to the floating substrate.

In accordance with another embodiment of the present disclosure, a semiconductor structure is provided. The semiconductor structure comprises a floating substrate and a conductive piece spaced from the floating substrate to form a capacitor, wherein the conductive piece is grounded.

In accordance with a further embodiment of the present disclosure, a method of manufacturing a semiconductor structure is provided. The method comprises locating a coupled capacitor generating a noise signal and grounding a formed capacitor to discharge therethrough the noise signal.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method, comprising:
providing a semiconductor structure comprising at least one capacitor partially formed over a floating substrate, at least one through-silicon-via (TSV) penetrating the floating substrate, and an electrical device disposed between the capacitor and the TSV; and
coupling a metal layer of the capacitor to ground to discharge a noise signal that is provided by the TSV to the floating substrate when an integrated circuit (IC) including the semiconductor structure is operated at a radio frequency, wherein the at least one capacitor and the electrical device are formed in a dielectric layer formed over the floating substrate.

2. The method of claim 1, wherein the at least one capacitor is formed by a semiconductor layer disposed over the floating substrate, and a dielectric layer disposed between the semiconductor layer and metal layer.

3. The method of claim 1, wherein the semiconductor structure further comprises a seal ring that is grounded.

4. The method of claim 3, further comprising coupling the metal layer of the capacitor to the seal ring to discharge the noise signal.

5. The method of claim 1, wherein the metal layer of the capacitor has a T-shaped member in a plane parallel to a top surface of the floating substrate.

6. The method of claim 5, wherein the T-shaped member has two portions thereof adjacent to the electrical device.

7. The method of claim 5, wherein the T-shaped member and the floating substrate have one of capacitances equal to and higher than 4 pF stored therebetween.

8. The method of claim 1, wherein the semiconductor structure is a radio frequency integrated circuit.

9. A method to operate a semiconductor structure, comprising:
identifying a coupled capacitor that generates a noise signal; and
grounding a formed capacitor to discharge therethrough the noise signal,
wherein the formed capacitor k provided by a semiconductor layer disposed over a floating substrate, a metal layer, and a first dielectric layer disposed between the semiconductor layer and metal layer, and
wherein the formed capacitor and an electrical device are formed in a second dielectric layer formed over the floating substrate.

10. The method of claim 9, further comprising:
providing a ground to measure S-parameters of a plurality of semiconductor parts included in the semiconductor structure;
transforming the S-parameters to obtain respective capacitances of the plurality of semiconductor parts;
deciding a largest capacitance from the respective capacitances of the plurality of semiconductor parts; and
defining a corresponding semiconductor part having the largest capacitance as the coupled capacitor.

11. The method of claim 9, wherein the semiconductor structure further comprises a seal ring that is grounded.

12. The method of claim 11, wherein the grounding the formed capacitor comprises:
coupling the metal layer of the formed capacitor to the grounded seal ring.

13. The method of claim 9, wherein the noise signal is provided by a through-silicon-via (TSV) penetrating the floating substrate to the floating substrate when an integrated circuit (IC) including the semiconductor structure is operated at a radio frequency.

14. The method of claim 13, wherein the semiconductor structure further comprises an electrical device disposed between the formed capacitor and the TSV.

15. The method of claim 14, wherein the grounding the formed capacitor to discharge therethrough the noise signal comprises:
preventing the noise signal from affecting the electrical device.

16. A method, comprising:
providing a semiconductor structure comprising a floating substrate with a semiconductor layer formed thereover, a capacitor formed by the semiconductor layer, a metal layer, and a first dielectric layer disposed between the semiconductor layer and metal layer, a through-silicon-via (TSV) penetrating the floating substrate, and an electrical device disposed between the capacitor and the TSV; and
coupling the metal layer of the capacitor to ground to discharge a noise signal that is induced by a liner structure of the TSV and provided to the floating substrate when an integrated circuit (C) including the semiconductor structure is operated at a radio frequency,
wherein the capacitor and the electrical device are formed in a second dielectric layer formed over the floating substrate.

17. The method of claim 16, wherein the semiconductor structure further comprises a seal ring that is grounded.

18. The method of claim 17, further comprising:
coupling the metal layer of the capacitor to the seal ring to discharge the noise signal.

19. The method of claim 17, wherein the metal layer of the capacitor has a T-shaped member in a plane parallel to a top surface of the floating substrate.

20. The method of claim 19, wherein the T-shaped member has two portions thereof adjacent to the electrical device.

* * * * *